United States Patent
Toriyama et al.

[11] Patent Number: 6,037,195
[45] Date of Patent: Mar. 14, 2000

[54] PROCESS OF PRODUCING THIN FILM TRANSISTOR

[75] Inventors: Shigetaka Toriyama, Kumagaya; Hideo Hirayama, Yokohama, both of Japan

[73] Assignee: Kabushiki Kaisha Toshiba, Kawasaki, Japan

[21] Appl. No.: 09/154,446

[22] Filed: Sep. 16, 1998

[30] Foreign Application Priority Data

Sep. 25, 1997 [JP] Japan ..................................... 9-260315

[51] Int. Cl.$^7$ ..................................................... H01L 21/00
[52] U.S. Cl. .......................... 438/149; 438/301; 438/725; 148/DIG. 53
[58] Field of Search ........................... 438/149, 181–185, 438/301, 725, 305, 303, 519, 521, FOR 188; 148/DIG. 53; 216/23, 49, 67, 63

[56] References Cited

U.S. PATENT DOCUMENTS 5,292,675  3/1994  Codama .
5,476,802  12/1995  Yamazaki et al. .
5,698,881  12/1997  Yoshitomi et al. .

FOREIGN PATENT DOCUMENTS 3-148834  6/1991  Japan .
408250604A  9/1996  Japan .

OTHER PUBLICATIONS

Ono et al., A 40 nm Gae Length n–MOSFET, pp. 1822–1830, IEEE, V. 42, No. 10, Oct. 1995.

*Primary Examiner*—Charles Bowers
*Assistant Examiner*—Scot J. Hawranek
*Attorney, Agent, or Firm*—Pillsbury Madison & Sutro LLP

[57] ABSTRACT

A process of producing a thin film transistor of a liquid crystal display device according to the present invention comprises the steps of forming a semiconductor layer on an insulation substrate, stacking an insulation film and a conductive layer on the semiconductor layer, patterning the conductive layer to form a gate electrode, reducing a width of a mask used at formation of the gate electrode in a prescribed amount to form an offset region, implanting highly concentrated impurity ions into a part of the semiconductor layer where there are not the mask or the conductive layer to form an $N^+$-polysilicon layer, re-etching the conductive layer by using the mask used at formation of the gate electrode made narrower by the offset region, and implanting low concentrated impurity ions into the semiconductor layer below the conductor region removed by re-etching to form an $N^-$-polysilicon layer.

13 Claims, 2 Drawing Sheets

PROCESS OF PRODUCING THIN FILM TRANSISTOR

BACKGROUND OF THE INVENTION

The present invention relates to a process of producing a thin film transistor in an active matrix type liquid crystal display apparatus using a thin film transistor.

Recently, a display device employing liquid crystal has been widely used. Therefore, miniaturization and low power consumption of a liquid crystal display apparatus are further required. Together with this, a method of integrally forming a thin film transistor that serves as a switching element to be used as a drive element on a glass substrate of a liquid crystal panel has been used in practice. As a method of forming a semiconductor region of a thin film transistor, a method using polycrystalline silicon is used.

As for a method of forming a thin film transistor, as disclosed in Jpn. Pat. Appln. KOKAI Publication No. 3-148834, a channel separating region (11) is first formed on a P-type Si substrate (10) and a gate electrode (13) is formed in a region sectioned by the channel separating region (11) via a gate oxide film (12) (FIG. 1a). Formation of the gate electrode (13) can be carried out by forming a Poly-Si film of a prescribed pattern on the Si substrate (10), forming a resist film (14) of a prescribed pattern, and removing by etching the Poly-Si film while using the resist film (14) as a mask, similarly to the prior art. At this time, the length of the gate electrode (13) is formed to be greater than the final length in a prescribed amount, i.e. an amount corresponding to a side wall (6) as shown in FIG. 2.

Next, a resist film (15) for covering regions other than those that become a source and a drain, for example, regions of the channel separating region (11), the P-channel type MOS transistor, etc. is formed without removing the resist film (14) on the gate electrode (13), and N$^+$-type regions (16S) (16D) are formed by implanting highly concentrated N-type impurity, for example, arsenic (As$^+$) while using these resist films (14) (15) as masks (FIG. 1b). The N$^+$-type regions (16S) (16D) respectively become a source region and a drain region.

Next, the resist films (14) (15) are isotropically removed in a prescribed amount by the plasma treatment including oxygen (FIG. 1c). In this plasma treatment, the resist film (14) is removed in an amount corresponding to the size of the gate electrode (13) that is formed to be larger than necessary. That is, part of the resist film (14) is removed so that the size of the resist film (14) left after the plasma treatment can be that of a final gate electrode (13'). Further, the gate electrode (13) is etched by using a resist film (14') in a prescribed size as a mask, both sides of the gate electrode (13) are removed, and N-type impurity, for example, P$^+$ is implanted at a concentration lower than that when the N$^+$-type regions (16S) (16D) are formed while using the resist films (14') (15') as masks to form N$^-$-type diffusion regions (17S) (17D).

However, according to the thin film transistor producing method described in Jpn. Pat. Appln. KOKAI Publication No. 3-148834, the width of the LDD (Lightly Doped Drain) is determined according to the lithography, and therefore, the widths of the LDDs formed at both left and right sides of the gate are different or vary from substrate to substrate because of warp of the glass substrate having Si or an error in positioning the mask. This can make the magnitude of the ON current of the thin film transistor irregular, and therefore, the yield and reliability of the products cannot be improved. As a result, the producing cost of the liquid crystal display apparatus may be increased.

BRIEF SUMMARY OF THE INVENTION

The object of the present invention is to provide a process of producing a thin film transistor using polycrystalline silicon as a semiconductor layer, which can provide an LDD region having a uniform width at a low cost.

The present invention, there is provided a method of producing a thin film transistor, comprising the steps of: forming an insulation film and an electrically conductive film on a semiconductor layer; forming a resist mask of a first pattern on the conductive film; patterning the conductive film into the first pattern; forming a resist mask of a second pattern, by removing an outer peripheral portion of the resist mask of the first pattern; performing first implantation of impurities into the semiconductor layer, with the conductive film of the first pattern as a mask; patterning the conductive film into the second pattern, with the resist mask of the second pattern as a mask; removing the resist mask of the second pattern; and performing second implantation of impurities into the semiconductor later, with the conductive film of the second pattern as a mask, after removing the resist mask of the second pattern.

In addition, the producing process is characterized in that a step of removing a resist mask having a first pattern is isotropic etching.

Further, the producing process is characterized in that concentration of the impurity implanted in the first implanting step is higher than that of the impurity implanted in the second implanting step.

Moreover, the semiconductor layer, of the thin film transistor of the present invention, is characterized by including polycrystalline silicon.

Furthermore, the present invention, there is providing a method of producing a thin film transistor, comprising the steps of: forming an insulation film and a conductive film, on a semiconductor layer having a first semiconductor region and a second semiconductor region; forming a resist mask covering the first semiconductor region and having a first pattern over the second semiconductor region; patterning the conductive film into the first pattern; performing first implantation of a P-type impurities into the second semiconductor region, with the conductive film of the first pattern as a mask; removing the resist mask of the first pattern; forming a resist mask covering the second semiconductor region and having a second pattern over the first semiconductor region; patterning the conductive film into the second pattern; forming a resist mask of a third pattern, by removing an outer peripheral portion of the resist mask of the second pattern; performing second implantation of an N-type impurities into the first semiconductor region, with the conductive film of the second pattern as a mask; patterning the conductive film into the third pattern; removing the resist mask of the third pattern from the first semiconductor region; and performing third implantation of N-type impurities into the first semiconductor region, with the conductive film of the third pattern as a mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A process of producing a thin film transistor used for a liquid crystal display apparatus will be described in detail with reference to FIGS. 1 to 10.

Figure 1:
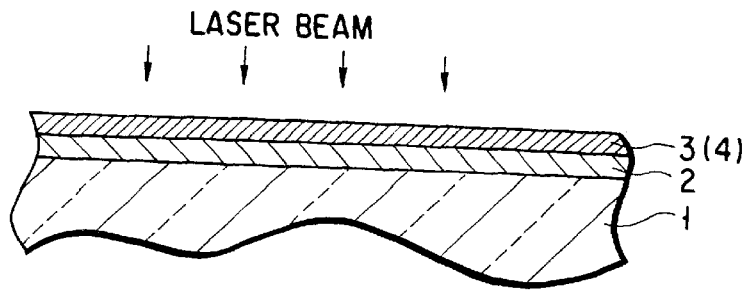
FIGS. 1 to 10 are schematic views explaining in order the steps of producing a thin film transistor array of the present invention.

In a step shown in FIG. 1, a passivation film 2 having a prescribed thickness is formed on a glass substrate 1 by the method of, for example, PE (plasma enhanced)-CVD or sputtering and then an amorphous silicon (a-Si) layer 3 is stacked with a prescribed thickness. As the material of the passivation film 2 silicon nitride (SiOx) is preferably selected from the viewpoint of ion blocking to Na and the like. The thickness of the amorphous silicon layer 3 ranges from 50 to 100 nm.

Next, in order to reduce the amount of hydrogen included in the amorphous silicon layer 3, the layer is heated (thermally annealed) for 1 hour at about 500° C. by using, for example, an oven. Then, the amorphous silicon layer 3 is heated by irradiating an energy beam (laser light) which is represented by, for example, excimer laser of XeCl and the like thereon, once fused, and cooled (made to dissipate heat). The fused amorphous silicon layer 3 is thereby crystallized to be a polycrystalline silicon layer 4.

Figure 2:
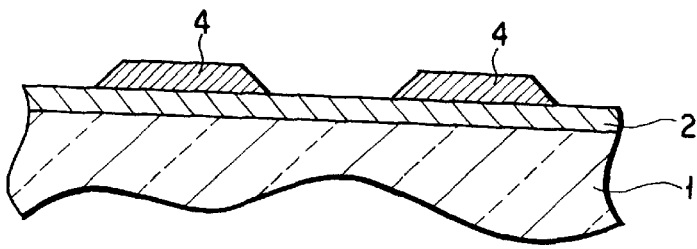

Next, as shown in FIG. 2, a resist mask (not shown) of a prescribed pattern is formed on the poly-silicon layer 4 and the poly-silicon layer is patterned by the etching. At this time, etching is carried out to make the processed edge in the of form of, for example, taper, by dry-etching of down flow using fluorine-based gas represented by, for example, $CF_4$. Then, the resist mask used for the etching is removed by the plasma-ashing using $O_2$ or an organic alkali solution.

Figure 3:
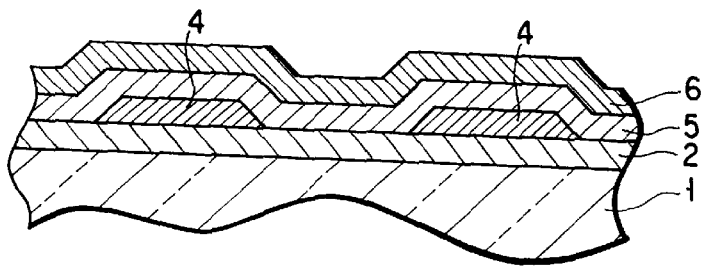

Next, as shown in FIG. 3, a first insulation film is formed in the method of PE-CVD or AP-CVD, using, for example, TEOS (tetraethoxysilane, first insulation film) 5 as material gas. The film thickness is set to range from 50 to 150 nm. Then, an alloy layer (first conductive layer) 6 of molybdenum and tungsten (MoW) is formed by sputtering so as to be about 250 nm thick. MoW has a columnar crystalline structure, which is convenient for a processing from vertical direction, and can be advantageously applied to products which are required the accuracy in patterning. In addition, since the MoW has a high melting point, it is hardly influenced by the following steps of thermal treatment.

Figure 4:
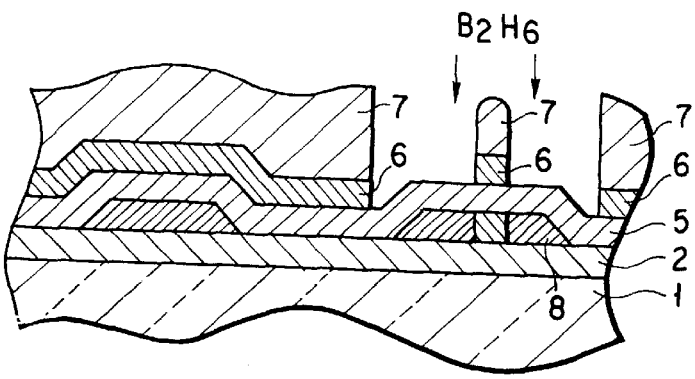

Next, as shown in FIG. 4, a resist mask (photomask) 7 is formed on the first conductive layer 6 so as to be patterned in a prescribed form and the MoW layer in a region corresponding to the portion where a p-type transistor of the poly-silicon layer 4 is to be formed is etched by photolithography.

Subsequently, a III-group compound of $B_2H_6$ is implanted with the dose amount of $4\times10^{15}$ atom/cm$^2$ at the accelerated voltage of 50 keV, into the poly-silicon layer 4 in the region where the MoW layer 6 is removed by etching, and a P$^+$-poly-silicon region 8 layer is thereby formed. The mask 7 is removed after the implantation of the III-group compound of $B_2H_6$.

Figure 5:
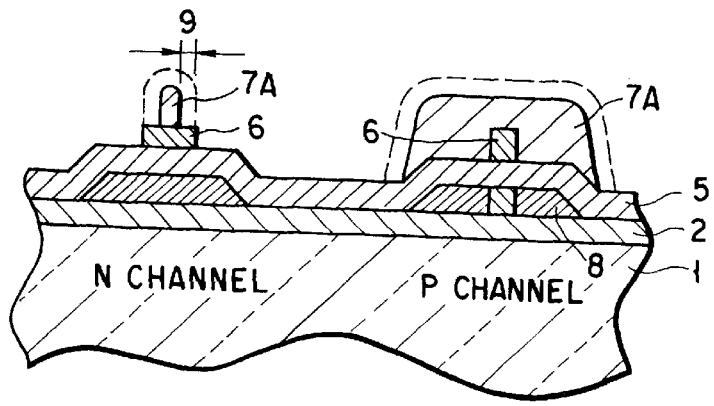

Next, as shown in FIG. 5, an organic mask 7A is formed by photolithography on the MoW (first conductive layer) 6 at the portion of the poly-silicon layer 4 where an N-type transistor is to be formed, and is etched. The mask 7A is used to protect the MoW 6 for the P-type transistor and the P$^+$-poly-silicon region 8 formed in the step of FIG. 4.

When the MoW (first conductive layer) 6 where the N-type transistor is to be formed is etched, the shape of the MoW is required to have high processing accuracy since the MoW 6 is used as the gate line. For this reason, it is etched by dry etching using plasma including gas of, for example, fluorine-based, chlorine-based and oxygen. By using fluorine-based or chlorine-based gas as the gas material, high etching selection ratio to the TEOS film (first insulation film) 5 serving as the ground can be obtained, since $SiCl_4$, which is a reaction product of chlorine gas included in the gas and the silicon oxide film that is the major component of the TEOS film, has low volatility. In addition, by optimizing the amount of oxygen in the gas, the etching speed of the MoW layer 6 can be enhanced to the etching speed of the TEOS layer 5. In the experiments it has been confirmed that adding $O_2$ at the amount of 30% to that of fluorine and chlorine is most effective.

When the MoW layer 6 is processed, the TEOS film 5 will be also etched, and it is preferable to control the gas by using an etching device that can control the amount of fluorine ions of the fluorine-based gas and chlorine ions of the chlorine-based gas, so as not to erase the TEOS film 5 by etching. If the TEOS film 5 is completely lost by the etching, the poly-silicon layer 4 serving as the ground will be also etched, and therefore, especial attention should be paid thereto. As for the etching device, by using a device including a power source for generating plasma and a power source used for irradiation of fluorine ions of the fluorine-based gas and chlorine ions of the chlorine-based gas to the etched material independently of each other, high selection to the TEOS film 5 serving as the ground can be maintained while keeping the high etching speed.

After the MoW layer 6 is etched, the organic mask (resist) used for the etching is isotropically etched by the plasma etching using mainly $O_2$ gas. In this case, a tiny amount of fluorine and chlorine may be added to $O_2$ gas, but it is preferable to add those at the amount less than the necessary one since their addition also erases the MoW layer 6 and the TEOS layer 5.

By isotropically etching the mask 7A in this manner, an offset region 9 is formed at the end portion of the MoW layer 6 and the end portion of the mask 7A.

The width of the offset region 9 is finally equal to that of an LDD (Lightly Doped Drain) region.

The width of LDD region preferably is in the range from 0.2 to 1.0 µm. The offset region 9 is set to be able to provide a proper width of the LDD region by optimizing the thickness of the mask 7A and the inclination angle of the end portion of the mask 7A. The mask 7A is etched (ashed) by isotropic etching, in an almost equal distance from the two directions orthogonal with the surface direction of the glass substrate 1, on the first conductive layer 6.

Figure 6:
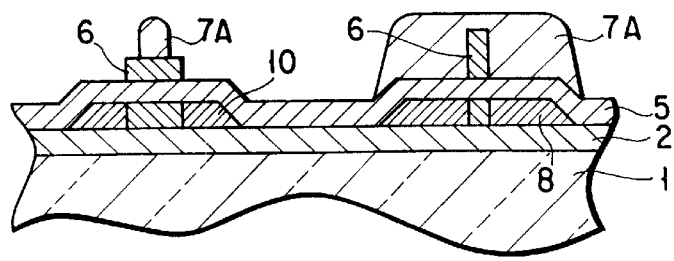

Next, in a step shown in FIG. 6, a V-group compound such as $PH_3$ is implanted at the dose amount of, for example, $1\times10^{15}$ atom/cm$^2$ at the accelerating voltage of 65 keV, into a portion of the poly-silicon layer 4 where there is not the MoW layer 6, by using a non-mass separation type ion implantation apparatus, with the first conductive film 6 having the offset 9 serving as a mask, to form an N$^+$ poly-silicon 10.

Figure 7:
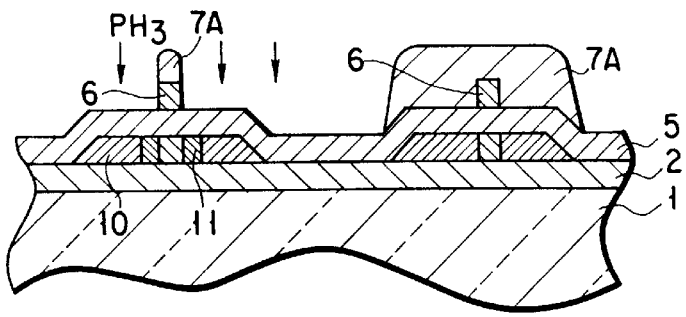

Then, as shown in FIG. 7, the MoW layer 6 is etched again by using the mask 7A which is provided with the shape of the isotropically etched mask, i.e. the offset 9 in the step shown in FIG. 5. The etching condition of this time is the dry etching using fluorine gas, oxygen gas and chlorine gas as described above. The mask 7A is removed after the etching. As for the step of removing the mask 7A, it is preferable to ash it by using, for example, $O_2$ gas after reduction using hydrogen-based gas since the mask 7A includesphosphorus.

Next, a V-group compound such as $PH_3$ is implanted at the dose amount of $1\times10^{13}$ atom/cm$^2$ at the accelerating voltage of 80 keV, into the poly-silicon layer 4 below the portion of the MoW layer 6 etched in the previous step, by using a non-mass separation type ion implantation apparatus, to form an $N^-$ poly-silicon (LDD) 11. That is, the width of the $N^-$ poly-silicon 11 is limited by the width of the offset region 9. The offset region 9 cannot be shifted as compared with the case employing the manner using another (new) mask, by optimizing the thickness of the mask 7A and the inclination angle of the end portion of the mask 7A, and the offset region 9 is set to have an almost equal width by the isotropic etching, and therefore, there are extremely few elements to vary the width of the LDD 11 in every substrate and the LDD 11 having a uniform width can be thereby provided.

Figure 8:
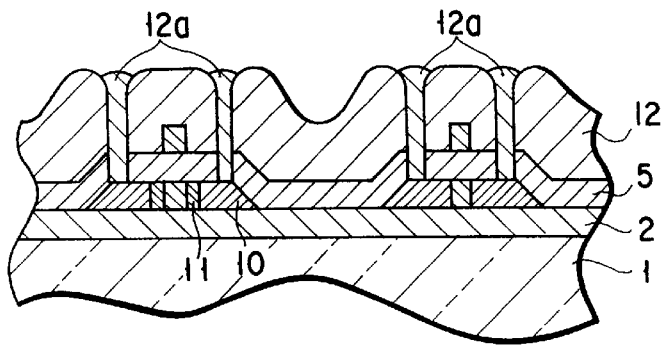

Next, in a step shown in FIG. 8, for example, silicon oxide 12 is formed to be 500 nm thick, as a second insulation film, by the method of PE-CVD, AP-CVD, spattering, etc. Then, contact holes 12a are formed on the first insulation film 5 on the $N^+$ poly-silicon layer 10 and the second insulation film 12, by photolithography, in the manner of the dry etching using $CHF_3$ gas, mixture gas of $CF_4$ and $H_2$, or mixture gas of $CF_4$ and CO. A conductive material 6 excellent in the resistance to acid is used for the processing of the contact holes, and the wet etching of diluted HF may be employed in a case where the patterning accuracy is not comparatively required strictly.

Figure 9:
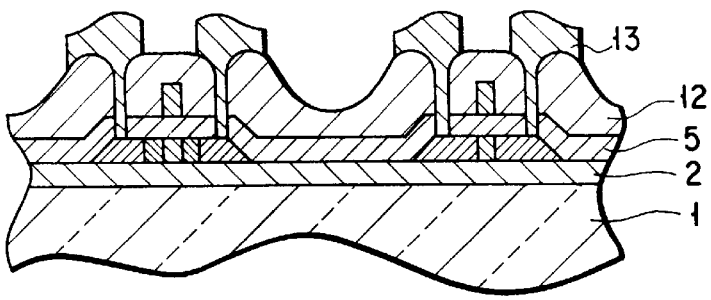

Next, as shown in FIG. 9, after the mask used for formation of the contact holes 12a has been removed, metals such as Al, Al—Nd, and Al—Si—Cu, and a lamination layer of Mo, Al and Mo, are stacked by the sputtering, as a second conductive layer serving as a signal line 13, and are patterned in a prescribed shape by photolithography.

Figure 10:
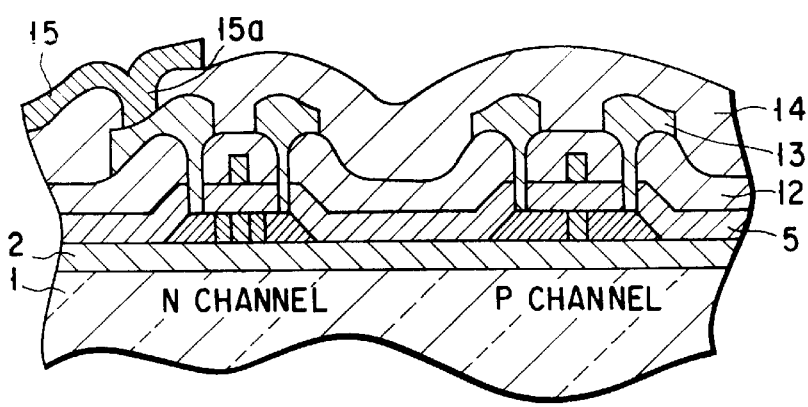

Next, in a step shown in FIG. 10, a silicon nitride film 14 is entirely formed as a protection film, and a contact hole 15a is formed in a region located over the signal line of the N-type thin film transistor. Finally, a transparent conductive film constituted by the contact hole 15a and a pixel electrode 15 is formed and patterned to provide a thin film transistor for active matrix type liquid crystal display device.

In the thin film transistor thus formed, the leak current can be reduced by about 2 to 3 digits as compared with a conventional thin film transistor, when the gate voltage is 0V. For this reason, concentration of the electric field at the terminal of the drain can be relaxed, charge implanted into the gate oxide film can be reduced, and reliability on the thin film transistor can be increased.

Further, the number of masks can be reduced by using a single mask in two steps, and the throughput can be thereby increased.

Moreover, the mask used for formation of the LDD does not need to be positioned, and its width is controlled by the isotropic etching, and therefore, it is possible to prevent the width of the LDD (Lightly Doped Drain) from being varied in every substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of producing a thin film transistor, comprising the steps of:

forming an insulation film and an electrically conductive film on a semiconductor layer;

forming a resist mask of a first pattern on said conductive film;

patterning said conductive film into said first pattern;

forming a resist mask of a second pattern, by removing an outer peripheral portion of the resist mask of said first pattern;

performing first implantation of impurities into said semiconductor layer, with the conductive film of said first pattern as a mask;

patterning the conductive film into said second pattern, with the resist mask of said second pattern as a mask;

removing the resist mask of said second pattern; and performing second implantation of impurities into said semiconductor layer, with the conductive film of said second pattern as a mask, after removing the resist mask of said second pattern.

2. A method according to claim 1, wherein the step of forming the resist mask of said second pattern includes a step of isotropic etching.

3. A method according to claim 2, wherein said isotropic etching uses an etching gas which includes as its main component oxygen gas in plasma atmosphere.

4. A method according to claim 3, wherein said etching gas includes at least one of fluorine gas and chlorine gas.

5. A method according to claim 1, wherein the impurities doped into the first implantation have substantially the same type of a conductive-type as the impurities doped into the second implantation and the concentration of the impurities of the first implantation is higher than the concentration of the impurities of the second implantation.

6. A method according to claim 1, wherein the first implantation is performed after removing said outer peripheral portion of the resist mask of said first pattern.

7. A method according to claim 1, wherein said conductive film is a refractory metal having a columnar crystalline structure.

8. A method according to claim 1, wherein said semiconductor layer is formed on an insulation substrate.

9. A method according to claim 1, wherein said semiconductor layer is poly-crystalline silicon.

10. A method of producing a thin film transistor, comprising the steps of:

forming an insulation film and a conductive film, on a semiconductor layer having a first semiconductor region and a second semiconductor region;

forming a resist mask covering said first semiconductor region and having a first pattern over said second semiconductor region;

patterning said conductive film into said first pattern;

performing first implantation of a P-type impurities into said second semiconductor region, with the conductive film of said first pattern as a mask;

removing the resist mask of said first pattern;

forming a resist mask covering said second semiconductor region and having a second pattern over said first semiconductor region;

patterning said conductive film into said second pattern;

forming a resist mask of a third pattern, by removing an outer peripheral portion of the resist mask of said second pattern;

performing second implantation of an N-type impurities into said first semiconductor region, with the conductive film of said second pattern as a mask;

patterning said conductive film into said third pattern;

removing the resist mask of said third pattern from said first semiconductor region; and performing third implantation of N-type impurities into said first semiconductor region, with the conductive film of said third pattern as a mask.

11. A method according to claim 10, wherein the concentration of the impurities implanted in said second implanting step is higher than the concentration of the impurities implanted in said third implanting step.

12. A method according to claim 11, wherein said semiconductor layer is formed on an insulation substrate.

13. A method according to claim 10, wherein said semiconductor layer is poly-crystalline silicon.

* * * * *